(12) United States Patent
Kwon et al.

(10) Patent No.: US 10,650,745 B2
(45) Date of Patent: May 12, 2020

(54) ORGANIC LIGHT-EMITTING DISPLAY DEVICE

(71) Applicants: LG DISPLAY CO., LTD., Seoul (KR); UNIVERSITY-INDUSTRY COOPERATION GROUP OF KYUNG HEE UNIVERSITY, Yongin-si, Gyeonggi-do (KR)

(72) Inventors: SunKap Kwon, Paju-si (KR); JangHyuk Kwon, Yongin-si (KR); MiJin Park, Seoul (KR); SeongKeun Kim, Seoul (KR)

(73) Assignees: LG DISPLAY CO., LTD., Seoul (KR); UNIVERSITY-INDUSTRY COOPERATION GROUP OF KYUNG HEE UNIVERSITY, Yongin-si (KR)

(*) Notice: Subject to any disclaimer, the term of this patent is extended or adjusted under 35 U.S.C. 154(b) by 0 days.

(21) Appl. No.: 15/667,257

(22) Filed: Aug. 2, 2017

(65) Prior Publication Data

US 2018/0061323 A1 Mar. 1, 2018

(30) Foreign Application Priority Data

Aug. 24, 2016 (KR) ........................ 10-2016-0107926

(51) Int. Cl.
*G09G 3/3258* (2016.01)
*H01L 51/52* (2006.01)
*H01L 51/44* (2006.01)
*H01L 51/50* (2006.01)
*G09G 3/3291* (2016.01)

(52) U.S. Cl.
CPC ......... *G09G 3/3258* (2013.01); *H01L 51/442* (2013.01); *H01L 51/5072* (2013.01); *H01L 51/5234* (2013.01); *G09G 3/3291* (2013.01); *H01L 51/5056* (2013.01); *H01L 51/5253* (2013.01); *H01L 2251/5315* (2013.01); *H01L 2251/558* (2013.01)

(58) Field of Classification Search
CPC ........................... H01L 51/442; G09G 3/3258
USPC .......................................................... 257/40
See application file for complete search history.

(56) References Cited

U.S. PATENT DOCUMENTS 9,876,040 B1 * 1/2018 Zhang .................. H01L 27/1274
2006/0145600 A1 * 7/2006 Yu ........................ H01L 51/5281
313/504

(Continued)

FOREIGN PATENT DOCUMENTS

CN 104518117 A 4/2015
CN 104659068 A 5/2015

(Continued)

*Primary Examiner* — Igwe U Anya
(74) *Attorney, Agent, or Firm* — Birch, Stewart, Kolasch & Birch, LLP

(57) ABSTRACT

An organic light-emitting display (OLED) device includes an anode, an organic emitting layer on the anode, and a cathode on the organic emitting layer. The cathode is configured to transmit at least a part of light emitted from the organic emitting layer and is formed of an alloy having a first metal and an oxide of a second metal. The cathode contains an alloy of a metal and a metal oxide and has an increased thickness, such that the process margin for the cathode can be improved.

17 Claims, 4 Drawing Sheets

(56) References Cited

U.S. PATENT DOCUMENTS

| | | | | |
|---|---|---|---|---|
| 2008/0029147 A1* | 2/2008 | Yang | ............... | H01L 51/102 |
| | | | | 136/244 |
| 2008/0217580 A1* | 9/2008 | Tanabe | ............ | C07C 235/60 |
| | | | | 252/301.16 |
| 2008/0258608 A1* | 10/2008 | Chao | ............... | H01L 51/5275 |
| | | | | 313/504 |
| 2008/0309225 A1 | 12/2008 | Shimizu et al. | | |
| 2010/0123152 A1* | 5/2010 | Sugisawa | ......... | H01L 51/5052 |
| | | | | 257/98 |
| 2014/0175410 A1* | 6/2014 | So | ..................... | H01L 27/288 |
| | | | | 257/40 |
| 2015/0041780 A1* | 2/2015 | Ma | ..................... | H01L 51/0072 |
| | | | | 257/40 |
| 2015/0287946 A1* | 10/2015 | Leem | ................... | C07F 5/02 |
| | | | | 257/40 |
| 2015/0303402 A1* | 10/2015 | Yoshikawa | ....... | H01L 51/5203 |
| | | | | 257/40 |
| 2017/0193897 A1* | 7/2017 | Zhang | ............... | H01L 51/56 |
| 2017/0207275 A1* | 7/2017 | Heo | ..................... | H01L 27/307 |

FOREIGN PATENT DOCUMENTS

| | | |
|---|---|---|
| KR | 10-2007-0043293 A | 4/2007 |
| WO | WO 00/69625 A1 | 11/2000 |

* cited by examiner

ORGANIC LIGHT-EMITTING DISPLAY DEVICE

CROSS-REFERENCE TO RELATED APPLICATIONS

This application claims the priority of Korean Patent Application No. 10-2016-0107926 filed on Aug. 24, 2016, in the Korean Intellectual Property Office, the disclosure of which is incorporated herein by reference.

BACKGROUND

Technical Field

The present disclosure relates to an organic light-emitting display (OLED) device, and in detail, to an OLED device having improved process margin for a cathode.

Description of the Related Art

An organic light-emitting display (OLED) device, unlike a liquid crystal display (LCD) device, is self-luminous. Accordingly, an OLED device does not require a separate light source and thus it can be made lighter and thinner. Further, an OLED device has advantages in that it is driven with low voltage to consume less power, and in that it represents vivid colors, has short response time, wide viewing angle and good contrast ratio (CR). For these reasons, an OLED device is currently under development as the next generation display device.

The OLED device includes an organic emitting layer that emits light as electrons and holes combine. Generally, an OLED device includes an anode, a hole injection layer (HIL), a hole transport layer (HTL), an organic emitting layer (EML), an electron transport layer (ETL), an electron injection layer (EIL) and a cathode.

The OLED device may be a bottom-emission OLED device or a top-emission OLED device depending on the direction in which light emitted from the emitting layer exits. In the bottom-emission OLED device, the light exits the device through the substrate on which the elements are formed. The upper electrode is formed as a reflective electrode whereas the lower electrode is formed as a transparent electrode. In an active matrix OLED device in which thin-film transistors are formed, the light cannot pass through the portions where the thin-film transistors are formed in the bottom-emission structure. As a result, the area where light can exit may be reduced. In contrast, in the top-emission structure, the upper electrode is formed of a transflective metal film whereas the lower electrode is formed of a transparent electrode including a reflective film, whereby the light exits in the direction away from the substrate. As a result, the area where the light can exit is wider than that of the bottom-emission structure.

SUMMARY

In top-emission OLED devices, the upper electrode through which the light exits is formed as a very thin, transflective metal film having the alloy of magnesium (Mg) and silver (Ag), for example.

When the upper electrode is formed as the transflective metal film having the alloy of magnesium (Mg) and silver (Ag), the upper electrode has very small thickness to increase the transmittance.

In this regard, the inventors of the application have noticed that, in top-emission OLED devices, numerous variations occur in the thickness of the thin upper electrode formed as the thin transflective metal film during the process of forming it, and accordingly the yield can be lowered.

In detail, when the upper electrode formed as the transflective metal film is formed with a thickness between 140 Å and 180 Å for increasing the transmittance, there may be large variations in the thickness during the process, such that the values of efficiency, color coordinates, viewing angle and lifespan may be dispersed, lowering the yield of the OLED device.

For a general upper electrode formed of a metal alloy, the transmittance changes greatly depending on the thickness. Therefore, in order to fabricate devices with uniform characteristics, it is necessary to maintain the thickness of the transflective metal films in the top-emission OLED devices.

For example, if the thickness of the upper electrode has a process deviation of approximately ±20 Å, there are large deviations in the efficiency, color coordinates, viewing angle and life span among production orders. This is resulted from the difference in the transmittance on the plane caused by the non-uniformity of the thickness of the upper electrode. The existing materials such as silver (Ag) and magnesium (Mg) exhibit very large variations in the transmittance with respect to the thickness.

In order to obtain the thickness uniformity of the upper electrode, a process of correcting the thickness is carried out by evaluating unit films during the process of fabricating the cathodes. Such process lowers the process yield and product yield and also increases the fabricating cost.

In view of the above, the inventors of the application have devised an OLED device having improved process margin for a cathode by reducing difference in the transmittance depending on the thickness of the cathode.

An aspect of the present disclosure is to provide an OLED device that increases the thickness of a cathode while improving the transmittance and surface resistance to increase uniformity in terms of efficiency, color coordinates and viewing angle by using an alloy of a metal and a metal oxide for the cathode.

Another aspect of the present disclosure is to provide an OLED device that reduces the unnecessary process of correcting the thickness of an upper electrode while increasing the process margin during the process of forming the upper electrode.

Another aspect of the present disclosure is to provide an OLED device that can be used for a large screen without any additional auxiliary line by reducing IR drop across device.

It should be noted that objects of the present disclosure are not limited to the above-described objects, and other objects of the present disclosure will be apparent to those skilled in the art from the following descriptions.

According to an embodiment of the present disclosure, there is provided an OLED device which comprises an anode, an organic emitting layer on the anode, and a cathode on the organic emitting layer. The cathode is configured to transmit at least a part of light emitted from the organic emitting layer and is formed of an alloy having a first metal and an oxide of a second metal. Therefore, the difference in the transmittance according to the thickness of the cathode is improved, such that the process margin for the cathode can be improved.

According to an embodiment of the present disclosure, there is provided an OLED device which comprises an anode, an organic emitting layer on the anode, a cathode on the organic emitting layer, the cathode being formed of an alloy having an oxide of a first metal, and a capping layer on the cathode. A thickness of the cathode is equal to or greater than 250 Å, and a difference (dN) between a refractive index of the cathode and a refractive index of the capping layer is within a range of 0<dN<1.6. Therefore, the difference in the transmittance according to the thickness of the cathode is improved, such that the process margin for the cathode can be improved.

According to an embodiment of the present disclosure, there is provided an OLED device which comprises a plurality of pixels in an display area of a substrate, each pixel having an organic light emitting layer between a cathode and an anode, and the cathode having specific light transmissive characteristics that achieve a top emission type display configuration and being made of an oxide metal alloy that exhibits improved thickness characteristics while achieving comparable characteristics for light emission efficiency, color coordinates, viewing angle and lifespan when compared to a cathode made of AgMg alloy.

The details of one or more embodiments of the subject matter described in this specification are set forth in the accompanying drawings and the description below.

According to an embodiment of the present disclosure, by using an alloy of a metal and a metal oxide for the cathode, the thickness of the cathode is increased while improving the transmittance and surface resistance, such that uniformity in terms of efficiency, color coordinates and viewing angle can be improved.

According to an embodiment of the present disclosure, the rate of change in the transmittance according to the change of the thickness of the cathode is lowered, such that the thickness uniformity and process margin of the device can be improved.

According to an embodiment of the present disclosure, when the OLED device is implemented as a large screen, it does not require an additional auxiliary line for supplying power to the cathode, by reducing the surface resistance to thereby reduce the IR drop, such that the aperture ratio can be improved.

According to an embodiment of the present disclosure, the refractive index of the capping layer is determined based on the refractive index of the cathode, such that influence of reflection and refraction on the interface between the cathode and the capping layer is reduced, thereby improving the luminous efficiency.

According to an embodiment of the present disclosure, the influence by the variation in the thickness of the cathode is reduced, such that it is possible to reduce the number of times of evaluations on unit films or even omit the evaluation in the process of forming the cathode, thereby improving the yield and saving the fabricating cost.

It should be noted that effects of the present disclosure are not limited to those described above and other effects of the present disclosure will be apparent to those skilled in the art from the following descriptions.

BRIEF DESCRIPTION OF THE DRAWINGS

The accompanying drawings, which are included to provide a further understanding of the disclosure and are incorporated and constitute a part of this application, illustrate embodiments of the disclosure and together with the description serve to explain various principles. In the drawings.

DETAILED DESCRIPTION

Figure 1:
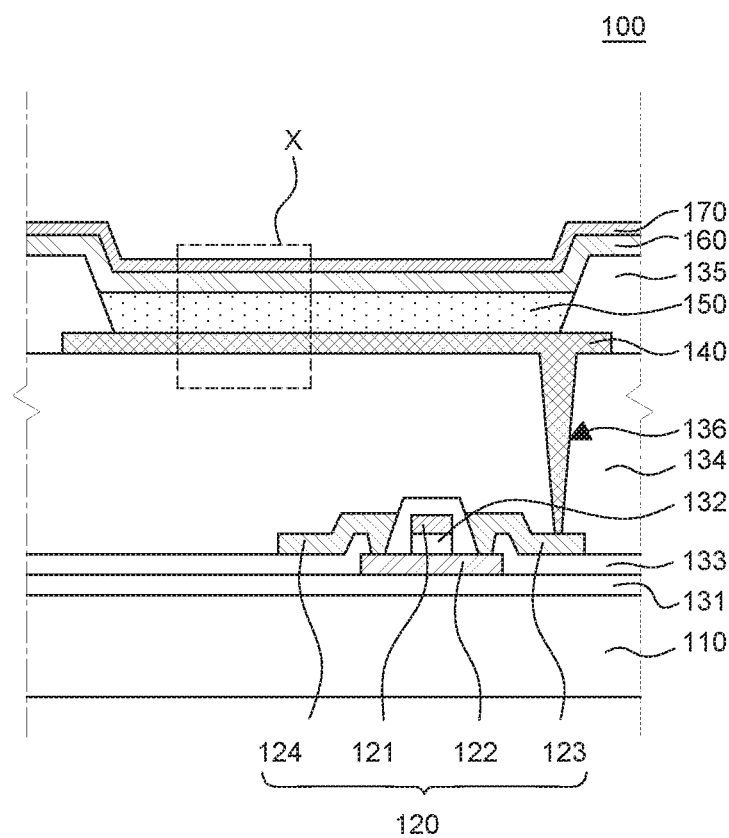
FIG. 1 is a cross-sectional view for illustrating an organic light-emitting display (OLED) device according to an embodiment of the present disclosure.

Advantages and features of the present disclosure and methods to achieve them will become apparent from the descriptions of embodiments hereinbelow with reference to the accompanying drawings. However, the present disclosure is not limited to embodiments disclosed herein but may be implemented in various different ways. The embodiments are provided for making the disclosure of the present disclosure thorough and for fully conveying the scope of the present disclosure to those skilled in the art. It is to be noted that the scope of the present disclosure is defined only by the claims.

The figures, dimensions, ratios, angles, the numbers of elements given in the drawings are merely illustrative and are not limiting. Like reference numerals denote like elements throughout the descriptions. Further, in describing the present disclosure, descriptions on well-known technologies may be omitted in order not to unnecessarily obscure the gist of the present disclosure. It is to be noticed that the terms "comprising," "having," "including" and so on, used in the description and claims, should not be interpreted as being restricted to the means listed thereafter unless specifically stated otherwise. Where an indefinite or definite article is used when referring to a singular noun, e.g. "a," "an," "the," this includes a plural of that noun unless specifically stated otherwise.

In describing elements, they are interpreted as including error margins even without explicit statements.

In describing positional relationship, such as "an element A on an element B," "an element A above an element B," "an element A below an element B" and "an element A next to an element B," another element C may be disposed between the elements A and B unless the term "directly" or "immediately" is explicitly used.

As used herein, a phrase "an element A on an element B" refers to that the element A may be disposed directly on the element B and/or the element A may be disposed indirectly on the element B via another element C.

The terms first, second and the like in the descriptions and in the claims are used for distinguishing between similar elements and not necessarily for describing a sequential or chronological order. These terms are used to merely distinguish one element from another. Accordingly, as used herein, a first element may be a second element within the technical idea of the present disclosure.

Like reference numerals denote like elements throughout the descriptions.

The drawings are not to scale and the relative dimensions of various elements in the drawings are depicted schematically and not necessarily to scale.

Features of various embodiments of the present disclosure may be combined partially or totally. As will be clearly appreciated by those skilled in the art, technically various interactions and operations are possible. Various embodiments can be practiced individually or in combination.

Hereinafter, embodiments of the present disclosure will be described in detail with reference to the accompanying drawings.

Figure 2:
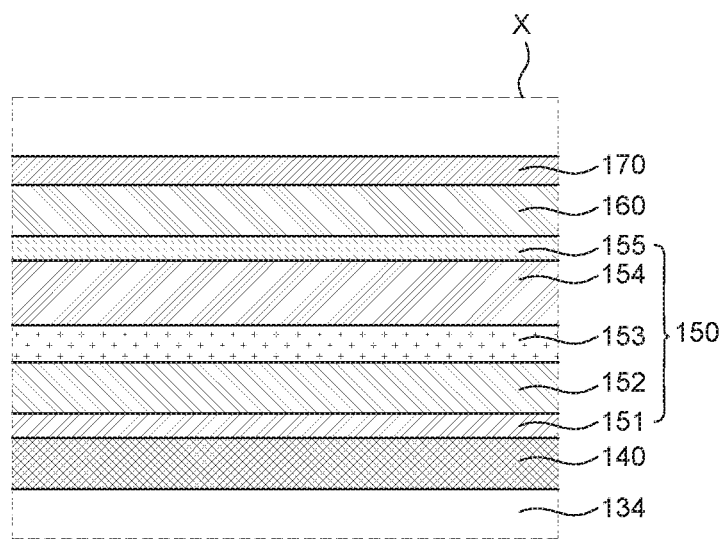
FIG. 2 is an enlarged view of area X of FIG. 1.

FIG. 1 is a cross-sectional view for illustrating an organic light-emitting display (OLED) device according to an embodiment of the present disclosure. FIG. 2 is an enlarged view of area X of FIG. 1. All the components of the OLED device according to all embodiments of the present disclosure are operatively coupled and configured.

Referring to FIG. 1, an OLED device 100 according to an embodiment of the present disclosure includes a substrate 110, a thin-film transistor 120, an anode 140, a plurality of organic layers 150, a cathode 160 and a capping layer 170.

The OLED device 100 includes a plurality of pixels. A pixel refers to a minimum unit area in which light is actually emitted and may also be referred to as a sub-pixel or a pixel area. A plurality of pixels may be gathered into a minimum group capable of producing white light. For example, three pixels, i.e., a red pixel, a green pixel and a blue pixel may form a single group. However, this is merely illustrative. A variety of pixel designs are possible. For convenience of illustration, FIG. 1 shows only one of the plurality of sub-pixels of the OLED device 100.

The substrate 110 is formed of an insulative material to support various components of the OLED device 100 during the fabricating process. For example, the substrate 110 may be formed of glass or a material having flexibility such as plastic. A buffer layer 131 is disposed on the substrate 110 to protect various components of the OLED device 100 from the permeation of moisture ($H_2O$) and hydrogen ($H_2$) from the outside of the substrate 110. It is to be noted that the substrate 110 may be removed during the fabricating process of the OLED device 100, and the buffer layer 131 may be eliminated depending on the structure or characteristics of the OLED device 100.

The thin-film transistor 120 including a gate electrode 121, an active layer 122, a source electrode 123 and a drain electrode 124 is disposed on the buffer layer 131. For example, the active layer 122 is disposed on the substrate 110, and a gate insulating layer 132 for insulating the active layer 122 from the gate electrode 121 is disposed on the active layer 122. An interlayer insulating layer 133 for insulating the gate electrode 121 from the source electrode 123 and the drain electrode 124 is disposed. The source electrode 123 and the drain electrode 124 in contact with the active layer 122 are disposed on the interlayer insulating layer 133. Although only the driving thin-film transistor among the various thin-film transistors that can be included in the OLED device 100 is shown herein for the sake of convenience, a switching thin-film transistor, a capacitor and the like may be included in the OLED device 100 as well. In addition, although the thin-film transistor 120 has a coplanar structure herein, a thin-film transistor having a staggered structure may also be used.

An over coating layer 134 is disposed over the thin-film transistor 120. The over coating layer 134 functions as a planarization layer for providing a flat surface over the substrate 110. The over coating layer 134 includes a contact hole 136 for electrically connecting the thin-film transistor 120 to the anode 140.

The anode 140 is disposed on the over coating layer 134. The anode 140 is an electrode configured to supply holes to the organic emitting layer 153 of the plurality of organic layers 150. The anode 140 is electrically connected to the thin-film transistor 120 through the contact hole 136 formed in the over coating layer 134, and may be electrically connected to the source electrode 123 of the thin-film transistor 120, for example. The anode 140 is disposed in each of the pixels and is spaced apart from another anode.

Since the OLED device 100 according to the embodiment of the present disclosure is a top-emission OLED device, the anode 140 may be formed of a transparent conductive material including a reflective layer so that the light emitted from the organic emitting layer 153 is reflected off the anode 140 to exit upwardly more efficiently.

For example, the anode 140 may be formed of a stack of two layers, i.e., a reflective layer and a transparent conductive layer formed of transparent conductive material stacked on the reflective layer, or a stack of three layers, i.e., a transparent layer, a reflective layer and a transparent layer stacked on one another in this order.

The transparent conductive material may be a material such as indium tin oxide (ITO) and indium zinc oxide (IZO). The reflective layer may be silver (Ag) or an alloy having silver, for example, silver or APC (Ag/Pd/Cu) alloy.

A bank 135 is disposed on the anode 140 and the over coating layer 134. The bank 135 may separate a sub-pixel region from another adjacent sub-pixel. And, the bank 135 may separate a pixel region including a plurality of sub-pixel regions from another.

The plurality of organic layers 150 is disposed on the anode 140. The plurality of organic layers 150 refers to organic layers constituting an organic emissive stack. The plurality of organic layers 150 may include various organic layers as desired. Among these, the organic emitting layer 153 for emitting light includes an essential element.

The plurality of organic layers 150 include a hole injection layer (HIL) 151 disposed on the anode 140, a hole transport layer (HTL) 152 disposed on the hole injection layer 151, an organic emitting layer (EML) 153 disposed on the hole transport layer 152, an electron transport layer (ETL) 154 disposed on the organic emitting layer 153, and an electron injection layer (EIL) 155 disposed on the electron transport layer 154.

The hole injection layer 151 is an organic layer disposed on the anode 140 and facilitating the injection of holes from the anode 140 to the organic emitting layer 153. The hole injection layer 151 may be formed of, but is not limited to, at least one among HAT-CN(dipyrazino[2,3-f:2',3'-h]quinoxaline-2,3,6,7,10,11-hexacarbonitrile), CuPc(phthalocyanine), and NPD(N,N'-bis(naphthalene-1-yl)-N,N'-bis(phenyl)-2,2'-dimethylbenzidine). The hole injection layer 151 may be eliminated depending on the structure and characteristics of the OLED device 100.

The hole transport layer 152 is an organic layer disposed on the hole injection layer 151 and facilitates the transportation of holes from the hole injection layer 151 to the organic emitting layer 153. The hole transport layer 152 may be formed of, but is not limited to, at least one among NPD(N,N'-bis(naphthalene-1-yl)-N,N'-bis(phenyl)-2,2'-dimethylbenzidine), TPD(N,N'-bis-(3-methylphenyl)-N,N'-bis-(phenyl)-benzidine), s-TAD(2,2',7,7'-tetrakis(N,N-dimethylamino)-9,9-spirofluorene) and MTDATA(4,4',4"-Tris (N-3-methylphenyl-N-phenyl-amino)-triphenylamine).

The organic emitting layer 153 is disposed on the hole transport layer 152. The organic emitting layer 153 may include a material capable of emitting light of a particular color. For example, the organic emitting layer 153 may include a luminous material capable of emitting red light, green light, blue light, or yellow-green light. But it is not limited thereto. The organic emitting layer 153 may include a luminous material capable of emitting light of other colors.

The electron transport layer 154 is an organic layer disposed on the organic emitting layer 153 and transfers electrons from the electron injection layer 155 to the organic emitting layer 153. The thickness of the electron transport layer 154 may be adjusted depending on the electron transportation characteristics. The electron transport layer 154 may be formed of, but is not limited to, at least one among Liq(8-hydroxyquinolinolato-lithium), PBD(2-(4-biphenyl)-5-(4-tert-butylphenyl)-1,3,4oxadiazole), TAZ(3-(4-biphenyl)4-phenyl-5-tert-butylphenyl-1,2,4-triazole), spiro-PBD, BCP(2,9-Dimethyl-4,7-diphenyl-1,10-phenanthroline) and BAlq (bis(2-methyl-8-quinolinolate)-4-(phenylphenolato) aluminium). The electron transport layer 154 may be eliminated depending on the structure and characteristics of the OLED device 100.

The electron injection layer 155 is disposed on the electron transport layer 154. The electron injection layer 155 is an organic layer that facilitates the injection of electrons from the cathode 160 to the organic emitting layer 153. The electron injection layer 155 may be a metal inorganic compound such as $BaF_2$, LiF, NaCl, CsF, $Li_2O$, and BaO. The electron injection layer 155 may be formed of, but is not limited to, at least one among HAT-CN(dipyrazino[2,3-f:2', 3'-h]quinoxaline-2,3,6,7,10,11-hexacarbonitrile), CuPc (phthalocyanine), and NPD(N,N'-bis(naphthalene-1-yl)-N, N'-bis(phenyl)-2,2'-dimethylbenzidine). The electron injection layer 155 may be eliminated depending on the structure and characteristics of the OLED device 100.

The cathode 160 is disposed on the electron injection layer 155. The cathode 160 supplies electrons to the organic emitting layer 153.

In the top-emission OLED device 100 in which light exits upwardly, for example, the cathode 160 is configured as a transflective metal film which transmits at least part of the light emitted from the organic emitting layer 153.

In detail, the OLED device 100 according to an embodiment of the present disclosure includes a cathode 160 including an alloy of a metal and a metal oxide.

In detail, the cathode 160 includes an alloy of a first metal and an oxide of a second metal.

The first metal may be one among, for example, silver (Ag), aluminum (Al) and copper (Cu). The second metal may be one among, for example, neodymium (Nd), tantalum (Ta), niobium (Nb), molybdenum (Mo), tungsten (W), titanium (Ti), silicon (Si), boron (B), nickel, (Ni), gold (Au), copper (Cu), aluminum (Al), tin (Sn), magnesium (Mg), platinum (Pt) and palladium (Pd).

The second metal is an oxide which forms an alloy with the first metal and is the material of the cathode. It is desirable that the second metal has a larger molecular weight than the first metal, because such second metal can suppress aggregation of the first metal at the time of forming the metal oxide alloy with the first metal. For example, the cathode 160 may be composed of $Ag:MoO_3$, which is an alloy of silver (Ag) and molybdenum oxide ($MoO_3$).

When the cathode 160 includes an alloy of the first metal and the metal oxide having a high transmittance, the thickness of the cathode 160 can be increased while improving the transmittance as compared to the transflective cathode having the alloy of magnesium (Mg) and silver (Ag).

The thickness of the cathode 160 may be adjusted taking into account the transmittance and the process margin. The cathode 160 has a thickness of 250 Å or more.

According to the embodiment of the present disclosure, by configuring the cathode 160 with the alloy of the metal and the metal oxide, the cathode 160 has improved transmittance and surface resistance even if the thickness of the cathode 160 is increased up to 250 Å or higher, compared to the cathode having the transflective metal, i.e., the alloy of magnesium (Mg) and silver (Ag).

When the thickness of the cathode 160 is 250 Å or more, the rate of change in the transmittance per 50 Å of the thickness of the cathode 160 becomes 1.5% or less, which is very small changed. Therefore, the uniformity of the thickness can be improved, and the process margin for the uniformity of the thickness of the cathode 160 is obtained, thereby improving the yield. The thickness uniformity of the cathode 160 is determined to be within ±10%, and the thickness may be approximately 30 Å to 40 Å.

In the top-emission OLED device using a metal alloy such as MgAg as a cathode is formed to have a small thickness, for example, approximately 200 Å. Accordingly, thickness correction is carried out by measuring the thickness of the unit film in the middle of the forming process. Such thickness correction lowers the process yield and product yield and increases the fabricating cost.

According to the embodiment of the present disclosure, the cathode 160 including the alloy of the metal and the metal oxide has improved thickness uniformity, and thus a less number of time of evaluations on the thickness of the unit film is required than the device with the cathode having the metal alloy of the thin thickness, thereby improving the yield and reducing the fabricating cost.

According to an embodiment of the present disclosure, by increasing the thickness of the cathode 160, it is possible to reduce the surface resistance. When the top-emission OLED device 100 is implemented as a large screen, a rapid IR drop may occur toward the center portion, and thus the performance of the OLED device may be deteriorated at the center portion. To avoid the IR drop, when existing OLED devices are implemented as a large screen, the larger screen includes additional auxiliary lines for supplying power to the cathodes.

The OLED device 100 according to an embodiment of the present disclosure lowers the surface resistance by increasing the thickness of the cathode 160. By doing so, the IR drop is reduced even when the OLED devices are implemented as a large screen, e.g., a screen having the size of 12 inches or more, and thus no additional auxiliary line for supplying power may be required. By eliminating the additional auxiliary lines required for a large screen, the OLED device 100 according to the embodiment of the present disclosure can improve aperture ratio while improving luminous uniformity at the center portion of the display device.

The alloy of the cathode 160 may have a ratio of the first metal to the oxidized second metal of at least 2:1, and the ratio may be from 3:1 to 5:1.

In addition, the refractive index of the cathode 160 may range from 0.2 to 1.8.

Referring to FIG. 1, the capping layer 170 is disposed on the cathode 160. The capping layer 170 is a protective layer for protecting the plurality of organic layers 150 and the cathode 160 from permeation of moisture ($H_2O$) and hydrogen ($H_2$) from the outside.

A passivation layer formed of a silicon nitride (SiNx) having a similar refractive index to the capping layer 170 may be further formed on the capping layer 170.

Since there is no difference in the refractive index between the passivation layer and the capping layer 170, the efficiency increases as the difference in the refractive index between the cathode 160 and the capping layer 170 decreases. Accordingly, the refractive index of the capping layer 170 may be adjusted based on the refractive index of the cathode 160. For example, the difference in the refractive index dN between the cathode 160 and the capping layer 170 may be the relationship 0<dN<1.6.

According to the embodiment of the present disclosure, since the cathode 160 is formed of an oxide alloy, the difference in the refractive index between the cathode 160 and the capping layer 170 decreases compared to that of the existing cathode having the alloy of silver (Ag) and magnesium (Mg), such that the influence of reflection and refraction at the interface between the cathode 160 and the capping layer 170 is reduced. As a result, the luminous efficiency can be improved.

As described above, the OLED device 100 according to the embodiment of the present disclosure includes the cathode 160 including the alloy of a metal and a metal oxide, and the cathode 160 has the increased thickness and the above-described ratio of the alloy, such that the process margin and the thickness uniformity can be improved. As a result, various effects such as improvement of the yield, reduction of the production cost, and improvement of the aperture ratio by eliminating the additional auxiliary line can be achieved.

Hereinafter, the effects of the present disclosure will be described. OLED devices according to Examples 1 to 4 of the present invention and Comparative Examples 1 to 8 were fabricated.

The OLED devices according to Examples 1 to 4 include the cathode including the alloy of the metal and the metal oxide according to an embodiment of the present disclosure, and have the structure shown in FIGS. 1 and 2. The OLED devices according to Examples 1 to 4 and Comparative Examples 1 to 8 have a structure in which an anode (ITO/APC/ITO), a hole injection layer (HIL), a hole transport layer (HTL, R'/G' HTL), an organic emitting layer (EML), an electron transport layer (ETL), an electron injection layer (EIL), a cathode, and a capping layer (CPL) are stacked on one another in this order. The OLED devices according to Examples 1 to 4 include $Ag:MoO_3$ as a cathode. The OLED devices according to Comparative Examples 1 to 8 have the same structures as that of Examples 1 to 4 except that Ag:Mg is included as a cathode and the thickness of some of the hole transport layers (R'/G' HTL) is different.

Table 1 below shows compositions and/or thicknesses of each of the layers of the OLED devices according to Examples 1 to 4 and Comparative Examples 1 to 8 described above.

TABLE 1

| | Red | | Green | |
|---|---|---|---|---|
| Layer | c. ex. 1 to 8 | ex. 1 to 4 | c. ex. 1 to 8 | ex. 1 to 4 |
| CPL | 40 nm | 40 nm | 40 nm | 40 nm |
| cathode | Mg:Ag | $Ag:MoO_3$ | Mg:Ag | $Ag:MoO_3$ |
| EIL | 3 nm | 3 nm | 3 nm | 3 nm |
| ETL | 30 nm | 30 nm | 30 nm | 30 nm |
| EML | 30 nm | 30 nm | 30 nm | 30 nm |
| R'/G' HTL | 60 to 70 nm | 60 to 70 nm | 20 to 30 nm | 20 to 30 nm |
| HTL | 100 nm | 100 nm | 100 nm | 100 nm |
| HIL (p-doping) | 10 nm | 10 nm | 10 nm | 10 nm |
| Anode ITO | 7 nm | 7 nm | 7 nm | 7 nm |
| APC | 100 nm | 100 nm | 100 nm | 100 nm |
| ITO | 7 nm | 7 nm | 7 nm | 7 nm |

Tables 2 and 3 below show the results of evaluating the transmittance (%) and variation in the transmittance (%) of the OLED devices according to Examples 1 to 4 and Comparative Examples 1 to 8 described above.

TABLE 2

| | Cathode | | Transmittance (%) | | | | | | Variation (%) |
|---|---|---|---|---|---|---|---|---|---|
| | Composition | Thickness | 440 nm | 480 nm | 520 nm | 560 nm | 600 nm | 640 nm | 520 nm |
| Ex. 1 | $Ag:MoO_3$ | 400 Å | 57.7 | 54.9 | 52.4 | 49.9 | 47.4 | 44.0 | — |
| Ex. 2 | $Ag:MoO_3$ | 350 Å | 59.2 | 56.2 | 53.0 | 50.6 | 48.1 | 44.8 | 0.65 |
| Ex. 3 | $Ag:MoO_3$ | 300 Å | 60.8 | 58.0 | 55.2 | 52.2 | 49.4 | 45.3 | 2.19 |
| Ex. 4 | $Ag:MoO_3$ | 250 Å | 61.2 | 59.9 | 56.7 | 54.4 | 51.1 | 47.3 | 1.52 |
| | | | | | Average | | | | 1.46 |

TABLE 3

| | Cathode | | Transmittance (%) | | | | | | Variation (%) |
|---|---|---|---|---|---|---|---|---|---|
| | Composition | Thickness | 440 nm | 480 nm | 520 nm | 560 nm | 600 nm | 640 nm | 520 nm |
| C. Ex. 1 | Ag:Mg | 220 Å | 38.5 | 36.6 | 33.6 | 30.7 | 26.6 | 23.4 | — |
| C. Ex. 2 | Ag:Mg | 200 Å | 42.9 | 41.3 | 38.8 | 36.3 | 32.2 | 28.9 | 5.2 |
| C. Ex. 3 | Ag:Mg | 180 Å | 45.3 | 43.8 | 41.6 | 39.4 | 35.4 | 32.1 | 2.8 |
| C. Ex. 4 | Ag:Mg | 160 Å | 50.0 | 49.6 | 48.0 | 46.1 | 42.2 | 38.7 | 6.4 |
| C. Ex. 5 | Ag:Mg | 140 Å | 54.6 | 54.9 | 53.8 | 52.1 | 48.3 | 44.9 | 5.8 |
| C. Ex. 6 | Ag:Mg | 120 Å | 60.0 | 61.4 | 60.6 | 58.7 | 55.1 | 52.0 | 6.8 |
| C. Ex. 7 | Ag:Mg | 100 Å | 65.2 | 67.1 | 66.2 | 64.9 | 61.1 | 58.5 | 5.6 |
| C. Ex. 8 | Ag:Mg | 80 Å | 69.7 | 72.2 | 71.5 | 70.8 | 67.2 | 64.7 | 5.3 |
| | | | | | Average | | | | 5.4 |

Referring to Tables 1 to 3, the OLED devices according to Examples 1 to 4 exhibit transmittances similar to those of Comparative Examples 1 to 8 even though the thickness of the cathode has been increased.

And, in Comparative Examples 1 to 8, the rate of change in the transmittance per 20 Å of the thickness of the cathode was 5.4%, whereas in Examples 1 to 4, the rate of change in the transmittance per 50 Å of the thickness of the cathode was 1.46%, which is significantly low.

As such, according to Examples 1 to 4, the rate of change in the transmittance versus the change in the thickness of the cathode is reduced, such that the thickness of the cathode can be increased, and thus sufficient process margin can be obtained.

Figure 3:
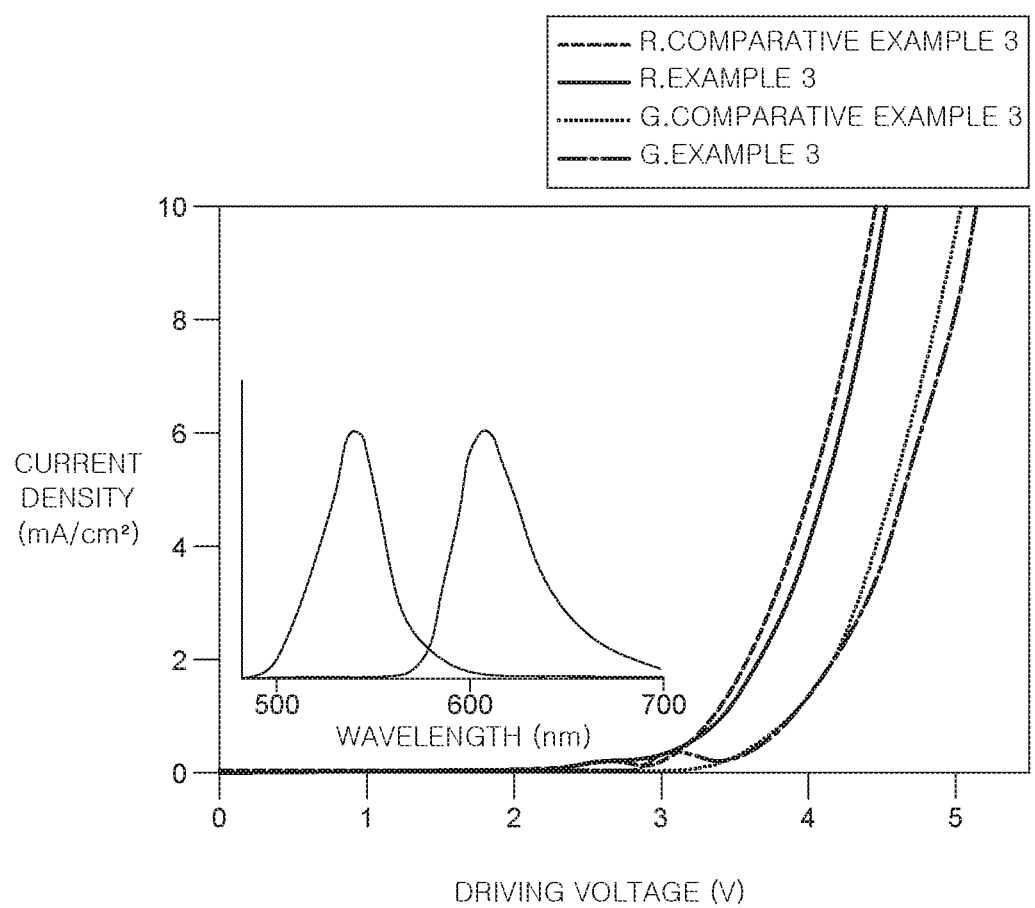
FIG. 3 is a graph showing the current density versus voltage of the OLED devices according to Example 3 and Comparative Example 3.
Figure 4:
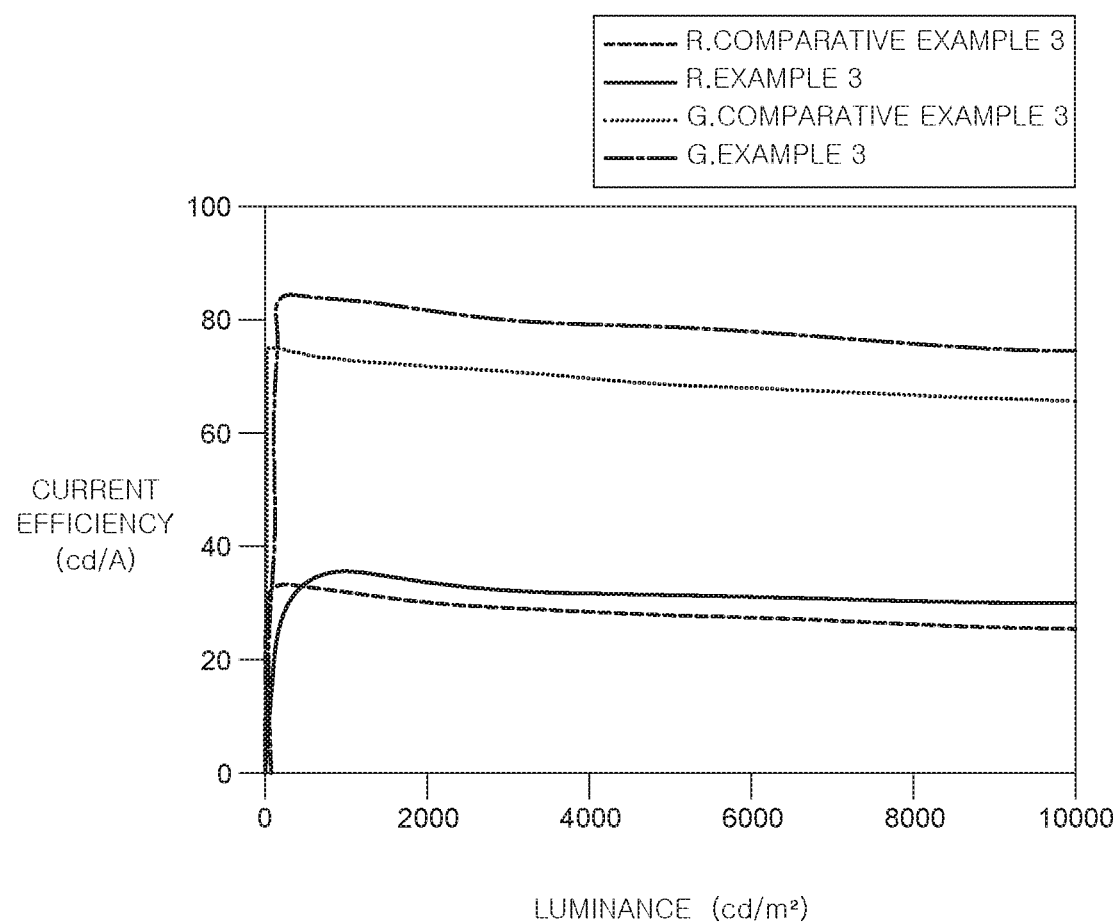
FIG. 4 is a graph showing the current efficiency versus luminance of the OLED devices according to Example 3 and Comparative Example 3.

Table 4 below shows results of evaluating the driving voltage, current efficiency, emission peak, FWHM, and color coordinates of the OLED devices according to Example 3 and Comparative Example 3 described above. FIG. 3 is a graph showing the current density versus voltage of the OLED devices according to Example 3 and Comparative Example 3. FIG. 4 is a graph showing the current efficiency versus luminance of the OLED devices according to Example 3 and Comparative Example 3.

TABLE 4

| Device | | Red | | Green | |
| --- | --- | --- | --- | --- | --- |
| | | C. Ex. 3 Mg:Ag | Ex. 3 Ag:MoO$_3$ | C. Ex. 3 Mg:Ag | Ex. 3 Ag:MoO$_3$ |
| @ 1000 nits | Driving Voltage (V) | 3.8 | 3.8 | 4.0 | 4.0 |
| | Current Efficiency (cd/A) | 31.5 | 34.6 | 73.3 | 83.1 |
| | EL peak | 611 nm | 607 nm | 538 nm | 538 nm |
| | FWHM | 48 nm | 44 nm | 37 nm | 38 nm |
| | CIE 1931 | (0.65, 0.35) | (0.64, 0.36) | (0.24, 0.72) | (0.26, 0.70) |

In the table, FWHM stands for full width at half maximum.

Referring to Table 4, FIGS. 3 and 4, it can be seen that in Example 3 and Comparative Example 3, the driving voltages are equal, the color coordinates, the luminous efficiencies and the FWHMs are equal or similar, and the current efficiencies slightly increase.

That is, even though the cathode of the OLED device according to Example 3 contains the alloy of a metal and a metal oxide such that the thickness of the cathode has been increased, Example 3 exhibits the electron injection characteristics and the efficiency characteristics equal to or higher than those of Comparative Example 3.

It can be concluded from the above-described results that the OLED device according to the embodiments of the present disclosure includes the cathode containing the alloy of a metal and a metal oxide, so that the rate of change in the transmittance versus the thickness of the cathode is very small and thus the process margin for the cathode can be improved and the emission performance of the cathode can be improved as compared to the existing devices.

The embodiments of the present disclosure can also be described as follows.

According to an embodiment of the present disclosure, an OLED device comprises an anode, an organic emitting layer on the anode, and a cathode on the organic emitting layer. The cathode is configured to transmit at least a part of light emitted from the organic emitting layer and is formed of an alloy having a first metal and an oxide of a second metal.

According to one or more embodiments, the first metal may be at least one among Ag, Al and Cu.

According to one or more embodiments, the second metal may be at least one among Nd, Ta, Nb, Mo, W, Ti, Si, B, Ni, Au, Cu, Al, Sn, Mg, Pt and Pd.

According to one or more embodiments, the thickness of the cathode may be equal to or greater than 250 Å.

According to one or more embodiments, the rate of change in a transmittance of the cathode per 50 Å of the thickness of the cathode may be equal to or less than 1.5%.

According to one or more embodiments, the thickness uniformity of the cathode may be within ±10%.

According to one or more embodiments, the alloy may have a ratio of the first metal to the oxide of the second metal of 2:1 or more.

According to one or more embodiments, the alloy may have a ratio of the first metal to the oxide of the second metal of 3:1 to 5:1.

According to one or more embodiments, the cathode may have no additional auxiliary line for supplying power.

According to one or more embodiments, the device may further comprise a capping layer on the cathode, and a refractive index of the capping layer may be based on a refractive index of the cathode.

According to one or more embodiments, the refractive index of the cathode may be within a range from 0.2 to 1.8.

According to one or more embodiments, the difference (dN) between the refractive index of the cathode and the refractive index of the capping layer may be within a range of 0<dN<1.6.

According to an embodiment of the present disclosure, there is provided an organic light-emitting display (OLED) device. The OLED device comprises an anode, an organic emitting layer on the anode, a cathode on the organic emitting layer, the cathode being formed of an alloy having an oxide of a metal, and a capping layer on the cathode. A thickness of the cathode is equal to or greater than 250 Å, and a difference (dN) between a refractive index of the cathode and a refractive index of the capping layer is within a range of 0<dN<1.6.

According to one or more embodiments, the metal may be at least one among Nd, Ta, Nb, Mo, W, Ti, Si, B, Ni, Au, Cu, Al, Sn, Mg, Pt and Pd.

According to one or more embodiments, a cathode may further have an additional metal. And the additional metal may be at least one among Ag, Al and Cu.

According to an embodiment of the present disclosure, there is provided an organic light-emitting display (OLED) device. The OLED device comprises a plurality of pixels in a display area of a substrate, each pixel having an organic light emitting layer between a cathode and an anode, and the cathode having specific light transmissive characteristics that achieve a top emission type display configuration and being made of an oxide metal alloy that exhibits improved thickness characteristics while achieving comparable characteristics for light emission efficiency, color coordinates, viewing angle and lifespan when compared to a cathode made of AgMg alloy.

According to one or more embodiments, the oxide metal alloy cathode having improved thickness characteristics may result in better cathode deposition uniformity and improved margin of error during manufacturing to result in higher manufacturing yield.

According to one or more embodiments, the oxide metal alloy cathode may comprise an oxide of a metal selected from a group consisting of Nd, Ta, Nb, Mo, W, Ti, Si, B, Ni, Au, Cu, Al, Sn, Mg, Pt and Pd, and may comprise an additional metal selected from a group consisting of Ag, Al and Cu.

According to one or more embodiments, the thickness of the oxide metal alloy cathode may be at least 250 Å.

According to one or more embodiments, the refractive index of the oxide metal alloy cathode may be within a range from 0.2 to 1.8.

Thus far, embodiments of the present disclosure have been described in detail with reference to the accompanying drawings. However, the present disclosure is not limited to the embodiments, and modifications and variations can be made thereto without departing from the technical idea of the present disclosure. Accordingly, the embodiments described herein are merely illustrative and are not intended to limit the scope of the present disclosure. The technical idea of the present disclosure is not limited by the embodiments. Therefore, it should be understood that the above-described embodiments are not limiting but illustrative in all aspects. The scope of protection sought by the present disclosure is defined by the appended claims and all equivalents thereof are construed to be within the true scope of the present disclosure.

What is claimed is:

1. An organic light-emitting display device comprising:
    an anode;
    an organic emitting layer on the anode; and
    a cathode, on the organic emitting layer, to transmit at least a part of light emitted from the organic emitting layer,
    wherein the cathode has a single layer of an alloy having a first metal and an oxide of a second metal to have the cathode have a thickness equal to or greater than 250 Å to about 400 Å,
    wherein the cathode has a specific light transmissive characteristics that achieve a top emission type display configuration using the alloy of the first metal and the oxide of the second metal that exhibits improved thickness characteristics while achieving comparable characteristics for light emission efficiency, color coordinates, viewing angle and lifespan when compared to a cathode made of AgMg alloy, and
    wherein the cathode having the improved thickness characteristics results in a better cathode deposition uniformity and an improved margin of error during manufacturing to result in a higher manufacturing yield.

2. The organic light-emitting display device of claim 1, wherein the first metal is at least one among Ag, Al and Cu.

3. The organic light-emitting display device of claim 1, wherein the second metal is at least one among Nd, Ta, Nb, Mo, W, Ti, Si, B, Ni, Au, Cu, Al, Sn, Mg, Pt and Pd.

4. The organic light-emitting display device of claim 1, wherein a rate of change in a transmittance of the cathode per 50 Å of the thickness of the cathode is equal to or less than 1.5%.

5. The organic light-emitting display device of claim 4, wherein a thickness uniformity of the cathode is within ±10%.

6. The organic light-emitting display device of claim 1, wherein the alloy has a ratio of the first metal to the oxide of the second metal of 2:1 or more.

7. The organic light-emitting display device of claim 6, wherein the alloy has a ratio of the first metal to the oxide of the second metal of 3:1 to 5:1.

8. The organic light-emitting display device of claim 1, wherein the cathode has no additional auxiliary line for supplying power, and
    wherein the cathode is configured as a single film.

9. The organic light-emitting display device of claim 1, further comprising:
    a capping layer on the cathode,
    wherein a refractive index of the capping layer is based on a refractive index of the cathode.

10. The organic light-emitting display device of claim 9, wherein the refractive index of the cathode is within a range from 0.2 to 1.8.

11. The organic light-emitting display device of claim 9, wherein a difference (dN) between the refractive index of the cathode and the refractive index of the capping layer is within a range of 0<dN<1.6.

12. An organic light-emitting display device comprising:
    an anode;
    an organic emitting layer on the anode;
    a cathode on the organic emitting layer, and having a single layer of an alloy having a first metal and an oxide of a second metal; and
    a capping layer on the cathode,
    wherein a thickness of the cathode is equal to or greater than 250 Å to about 400 Å,
    wherein a difference (dN) between a refractive index of the cathode and a refractive index of the capping layer is within a range of 0<dN<1.6,
    wherein the cathode has a specific light transmissive characteristics that achieve a top emission type display configuration using the alloy of the first metal and the oxide of the second metal that exhibits improved thickness characteristics while achieving comparable characteristics for light emission efficiency, color coordinates, viewing angle and lifespan when compared to a cathode made of AgMg alloy, and
    wherein the cathode having the improved thickness characteristics results in a better cathode deposition uniformity and an improved margin of error during manufacturing to result in a higher manufacturing yield.

13. The organic light-emitting display device of claim 12, wherein the second metal is at least one among Nd, Ta, Nb, Mo, W, Ti, Si, B, Ni, Au, Cu, Al, Sn, Mg, Pt and Pd.

14. The organic light-emitting display device of claim 12, wherein the first metal is at least one among Ag, Al and Cu.

15. An organic light-emitting display device comprising:
    a plurality of pixels in a display area of a substrate,
    each of the plurality of pixels having an organic light emitting layer between a cathode and an anode, and
    the cathode having specific light transmissive characteristics that achieve a top emission type display configuration and having a single layer of an oxide metal alloy that exhibits improved thickness characteristics while achieving comparable characteristics for light emission efficiency, color coordinates, viewing angle and lifespan when compared to a cathode made of AgMg alloy,
    wherein a thickness of the oxide metal alloy cathode is at least 250 Å, and
    wherein the oxide metal alloy cathode having the improved thickness characteristics results in a better cathode deposition uniformity and an improved margin of error during manufacturing to result in a higher manufacturing yield.

16. The organic light-emitting display device of claim 15, wherein the oxide metal alloy cathode comprises an oxide of a metal selected from a group consisting of Nd, Ta, Nb, Mo, W, Ti, Si, B, Ni, Au, Cu, Al, Sn, Mg, Pt and Pd, and comprises an additional metal selected from a group consisting of Ag, Al and Cu.

17. The organic light-emitting display device of claim 15, wherein a refractive index of the oxide metal alloy cathode is within a range from 0.2 to 1.8.

\* \* \* \* \*